(12) United States Patent
Mizuguchi (10) Patent No.: US 7,157,758 B2
(45) Date of Patent: Jan. 2, 2007

(54) SOLID-STATE IMAGE SENSING DEVICE AND METHOD OF FABRICATING A SOLID-STATE IMAGE SENSING DEVICE

(75) Inventor: Akira Mizuguchi, Turuoka (JP)

(73) Assignee: Seiko Epson Corporation (JP)

( * ) Notice: Subject to any disclaimer, the term of this patent is extended or adjusted under 35 U.S.C. 154(b) by 53 days.

(21) Appl. No.: 10/973,987

(22) Filed: Oct. 26, 2004

(65) Prior Publication Data

US 2005/0116250 A1 Jun. 2, 2005

(30) Foreign Application Priority Data

Oct. 27, 2003 (JP) .............................. 2003-366023

(51) Int. Cl.
*H01L 31/062* (2006.01)
*H01L 21/00* (2006.01)

(52) U.S. Cl. .......................................... 257/292; 438/57

(58) Field of Classification Search ................ 257/291, 257/292, 294; 438/57, 197, 525
See application file for complete search history.

(56) References Cited

U.S. PATENT DOCUMENTS 6,504,194 B1 * 1/2003 Miida ........................ 257/292

FOREIGN PATENT DOCUMENTS

| JP | 08-130300 | 5/1996 |
|----|-----------|--------|
| JP | 2001-177085 | 6/2001 |

OTHER PUBLICATIONS

Communication from Japanese Patent Office regarding counterpart application, May 9, 2006.

* cited by examiner

*Primary Examiner*—Mark V. Prenty
(74) *Attorney, Agent, or Firm*—Harness, Dickey & Pierce, P.L.C.

(57) ABSTRACT

A solid-state image sensing device is provided. In the device, a first floating p-type well and a second floating p-type well are disposed so as to overlap each other and are respectively provided in a light-receiving area and the area of a field effect transistor for light signal detection. A circular gate electrode is disposed so as to cover the overlapping section of the first floating p-type well with the second floating p-type well and is formed on an n-type channel doped layer.

6 Claims, 6 Drawing Sheets

SOLID-STATE IMAGE SENSING DEVICE AND METHOD OF FABRICATING A SOLID-STATE IMAGE SENSING DEVICE

RELATED APPLICATIONS

This application claims priority to Japanese Patent Application No. 2003-366023 filed Oct. 27, 2003 which is hereby expressly incorporated by reference herein in its entirety.

BACKGROUND

1. Field of the Invention

The present invention relates to a solid-state image sensing device and a method of fabricating a solid state image sensing device, and especially to those suitable for a Threshold Voltage Modulation Image Sensor (VMIS).

2. Related Art

In conventional solid-state image sensors, CCD sensors having a priority in image quality and CMOS sensors having a priority in low power consumption are commonly used.

Further, in Japanese Unexamined Patent Publication No. 2001-177085, for example, a threshold voltage modulation image sensor is disclosed, which realizes low power consumption equivalent to the CMOS sensors while providing image quality equivalent to the CCD sensors by embedding a light receiving section used for the CCD sensors in the CMOS circuits.

In conventional threshold voltage modulation image sensors, in order to prevent carriers generated in the light-receiving diode area from remaining in the light-receiving diode area without being sent to the carrier pockets, the edge of a floating p-type well in the light-receiving diode area and the edge of a floating p-type well in a field effect transistor for detecting light signals are designed to overlap.

However, if the overlapping section of the edge of the floating p-type well in the light-receiving diode and the edge of the floating p-type well in the field effect transistor for light signal detection is formed, a potential hole is generated in the overlapping section, in which the carrier easily pools.

It is problematic that if the overlapping section of the edge of the floating p-type well in the light-receiving diode area and the edge of the floating p-type well in the field effect transistor for light signal detection is shifted to the light-receiving diode area, the carriers pooled in the overlapping section are not completely swept out to a substrate side to be residual carriers when clearing the carrier pooled in the carrier pocket, which causes residual images.

Therefore, the present invention is intended to provide a solid-state image sensing device and a method of fabricating a solid-state image sensing device capable of reducing the residual carriers in clearing the carriers without preventing the carriers generated in the light-receiving diode area from flowing into the carrier pocket.

SUMMARY

In order to solve the problem described above, a solid-state image sensing device according to one aspect of the present invention comprises a first well of a second conductivity type formed in a semiconductor area of a first conductivity type, a second well of the second conductivity type formed in the semiconductor area of the first conductivity type, and disposed so as to overlap with the first well of the second conductivity type in the lateral direction thereof at the end portion of the second well of the second conductivity type, a gate electrode disposed on the second well of the second conductivity type so as to cover the overlapping portion, a drain layer of the first conductivity type disposed on one side of the gate electrode; a source layer of the first conductivity type disposed on the other side of the gate electrode, a channel area disposed under the gate electrode, and formed between the drain layer of the first conductivity type and the source layer of the first conductivity type, and a carrier pocket of the first conductivity type disposed under the channel area, and formed in the second well of the second conductivity type.

Accordingly, the overlapping portion of the edge portion of the first well of the second conductivity type and the edge portion of the second well of the second conductivity type can be disposed under the gate electrode, thus the slope of the potential in the depth direction of the overlapping section in the clearing step can be increased. Therefore, if the edge portion of the first well of the second conductivity type and the edge portion of the second well of the second conductivity type are overlapped with each other in order to prevent the carriers generated in the light-receiving diode area from remaining in the light-receiving diode area, the carriers stored in the overlapping portion can completely be swept out in the depth direction, thus the residual carrier can be reduced in the clearing step to reduce the residual image level without hindering the carriers generated in the light-receiving diode area from flowing into the carrier pocket.

Further, a solid-state image sensing device according to another aspect of the present invention further comprises an impurity layer of the first conductivity type formed in a surface layer of the first well of the second conductivity type, and a channel doped layer of the first conductivity type formed in a surface layer of the channel area.

Accordingly, pinning of the surface of the light-receiving diode area and the surface of the channel area becomes possible, and therefore the carriers caused by the defect of the semiconductor surface can be cancelled. Therefore, fixed pattern noises caused by the dark current can be reduced to improve picture quality.

Further, a solid-state image sensing device according to another aspect of the present invention further comprises a semiconductor substrate of the second conductivity type on which the semiconductor area of the first conductivity type is disposed, and an embedded layer of the first conductivity type disposed under the semiconductor area of the first conductivity type corresponding to the position of the first well of the second conductivity type.

Accordingly, while reducing the residual carriers in the clear step, the depletion layer can be enhanced in the depth direction of the first well of the second conductivity type. Accordingly, the carriers generated by light beams, such as a red colored light beam, having long wavelengths capable of reaching deep positions thereof can be efficiently collected, thus improving the sensitivity and the color reproducibility.

Further, a solid-state image sensing device according to another aspect of the present invention comprises an embedded layer of the second conductivity type disposed under the semiconductor area of the first conductivity type corresponding to the position of the second well of the second conductivity type.

According to the configuration, the depletion layer can be prevented from extending to the semiconductor area of the first conductivity type, and it is possible to efficiently apply the electric field applied via the gate electrode to the depletion layer of the second well of the second conductivity type. Therefore, the potential slope in the second well of the second conductivity type in the depth direction can be increased, thus efficiently executing a clearing operation of the carrier stored in the carrier pocket while enabling the carriers stored in the overlapping section of the edge portion of the first well of the second conductivity type with the edge portion of the second well of the second conductivity type to be completely swept out in the depth direction.

Further, in a solid-state image sensing device according to another aspect of the present invention, the carrier pocket of the first conductivity type is disposed near the source layer of the first conductivity type so as to be localized in a part of the channel area.

Accordingly, the distance between the carrier pocket of the first conductivity type and the drain layer of the first conductivity type can be increased to reduce the coupling capacitance of the carrier pocket of the first conductivity type with the drain layer of the first conductivity type. Therefore, it is possible to improve the linearity in converting the charges stored in the carrier pocket of the first conductivity type into the voltage by the source follower, thus improving picture quality.

Further, in a solid-state image sensing device according to another aspect of the present invention, the gate electrode has a circular shape, the source layer of the first conductivity type is formed in the surface layer of the second well of the second conductivity type so as to be disposed inside the circular shape, and the drain layer of the first conductivity type is extended to the impurity layer of the first conductivity type so as to disposed outside of the circular shape.

Thus, the periphery of the gate electrode can be maintained to a higher electrical potential. Accordingly, in case there is a defect in the periphery of the gate electrode, the carriers caused by the defect can be prevented from flowing into the carrier pocket of the first conductivity type, thus reducing fixed pattern noises.

Further, a method of fabricating a solid-state image sensing device according to another aspect of the present invention, comprises the step of forming a first well of a second conductivity type in a semiconductor area of a first conductivity type by ion implanting an impurity using a first resist pattern as a mask, the step of forming an embedded layer of the first conductivity type disposed under the first well of the second conductivity type by ion implanting an impurity using the first resist pattern as a mask, the step of forming a second well of the second conductivity type disposed so as to overlap with the first well of the second conductivity type in the lateral direction thereof at an edge portion of the second well of the second conductivity type in the semiconductor area of the first conductivity type by ion implanting an impurity using a second resist pattern as a mask, the step of forming an embedded layer of the second conductivity type disposed under the second well of the second conductivity type by ion implanting an impurity using the second resist pattern as a mask, the step of forming a channel doped layer of the first conductivity type in a surface layer of the second well of the second conductivity type by ion implanting an impurity using the second resist pattern as a mask, the step of forming a carrier pocket of the second conductivity type disposed locally under the channel doped layer of the first conductivity type by ion implanting an impurity using a third resist pattern as a mask, the step of forming a gate electrode disposed on the channel doped layer of the first conductivity type so as to cover the overlapping section, and the step of ion implanting an impurity using the gate electrode as a mask to form a drain layer of the first conductivity type and a source layer of the first conductivity type respectively on both sides of the gate electrode, and to form an impurity layer of the first conductivity type in a surface layer of the first well of the second conductivity type.

Accordingly, by modifying the mask pattern, the overlapping section of the edge of the first well of the second conductivity type and the edge of the second well of the second conductivity type can be disposed under the gate electrode. Therefore, without any additional fabrication step, the residual carrier in the clearing step can be reduced, thus reducing the residual image level.

Further, in a method of fabricating a solid-state image sensing device according to another aspect of the present invention, the ion implantation for forming the first well of the second conductivity type is executed in a slanted direction towards the second well of the second conductivity type.

Accordingly, without modifying the mask pattern, the overlapping section of the edge of the first well of the second conductivity type and the edge of the second well of the second conductivity type can be disposed under the gate electrode. Therefore, without any additional fabrication step, the residual carrier in the clearing step can be reduced, thus reducing the residual image level.

DETAILED DESCRIPTION

A solid-state image sensing device and a method fabricating the same according to an embodiment of the present invention is hereinafter described with reference to the accompanying drawings.

Figure 1:
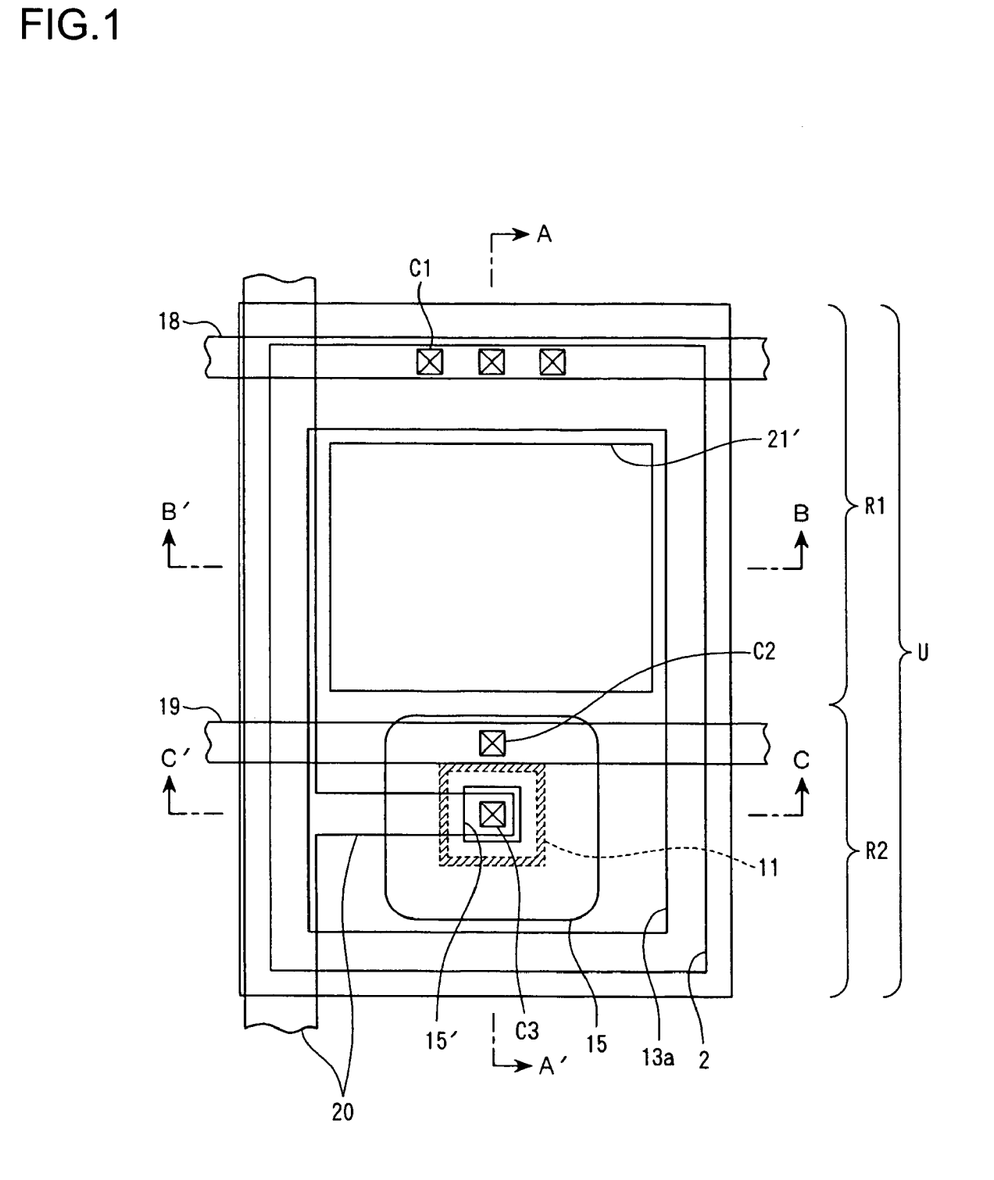
FIG. 1 is a plan view showing a schematic configuration of a solid-state image sensing device according to a first embodiment of the present invention.
Figure 2A:
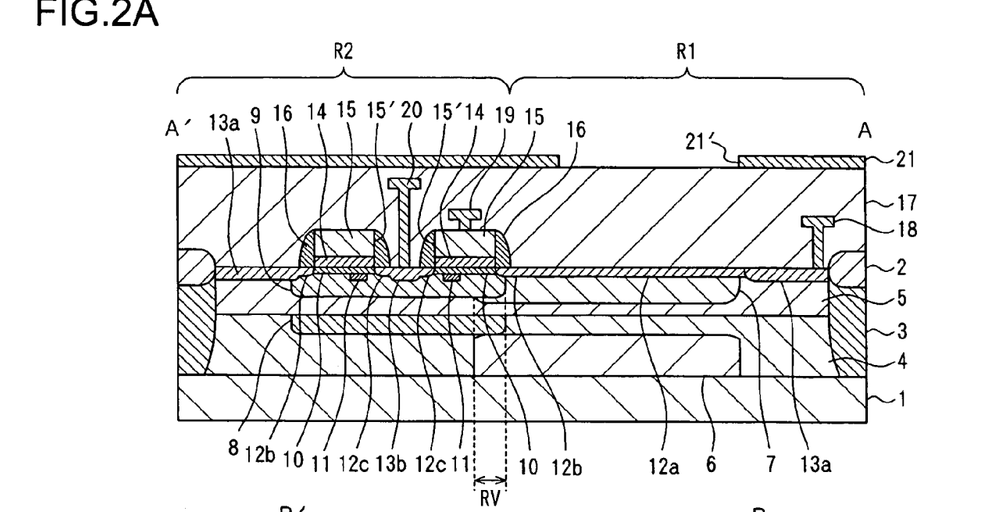
FIGS. 2A through 2C are cross-sectional views showing a schematic configuration of the solid-state image sensing device shown in FIG. 1.

FIG. 1 is a plan view showing a schematic configuration of the solid-state image sensing device according to a first embodiment of the present invention, FIG. 2A is a cross-sectional view along the A–A' line in FIG. 1, FIG. 2A is a cross-sectional view along the B–B' line in FIG. 1, FIG. 2A is a cross-sectional view along the C–C' line in FIG. 1.

Figure 2B:
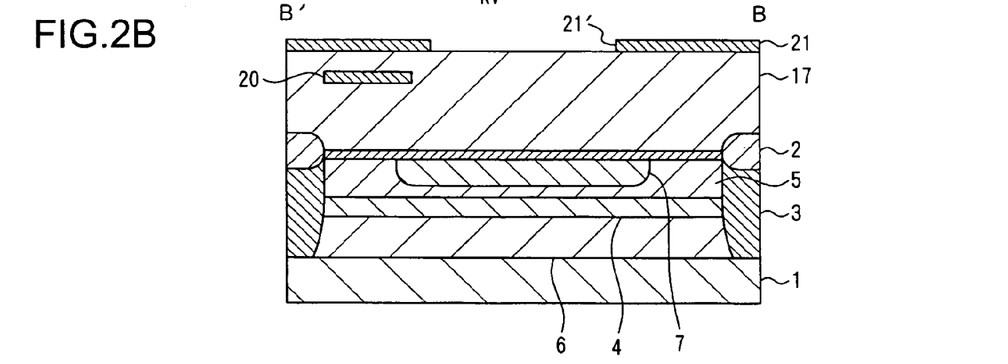
Figure 2C:
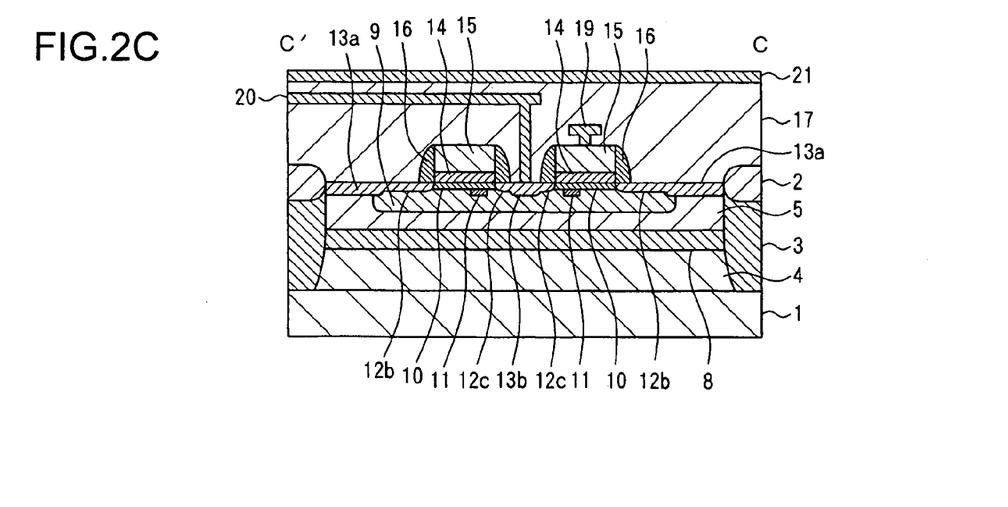

In FIGS. 1 and 2, a unit cell U is provided with a light-receiving area R1 and an area R2 for a field effect transistor for light signal detection. For the element separation of the unit cell U, a separation structure consisting of a gate electrode and a P-type diffusion area is generally used with an exception of the outermost effective pixels for which a separation structure consisting of an element separation film 2 is used.

A p⁻-type epitaxial layer 4 is formed on the P-type semiconductor substrate 1, and an n-type well 5 is formed in the p⁻-type epitaxial layer 4. Note that as a material for the semiconductor substrate 1, for example, Si, Ge, SiGe, SiC, GaAs, InP, GaP, GaN, and so on can be used. Further, the impurity concentration of the P-type semiconductor substrate 1 can be, for example, about $1\times10^{13}$ cm⁻³, and the impurity concentration of the p⁻-type epitaxial layer 4 can be, for example, about $1\times10^{15}$ cm⁻³.

The element separation film 2 is formed in the n-type well 5 so as to surrounding the periphery of the unit cell U, and a p⁺-type impurity area 3 embedded in the p⁻-type epitaxial layer 4 is formed under the element separation film 2 so as to contact the P-type semiconductor substrate 1.

A floating p-type well 7 is formed in the n-type well 5 while an n-type embedded layer 6 embedded in the p⁻-type epitaxial layer 4 is formed so as to be disposed under the floating p-type well 7. Further, an n⁺-impurity layer 12a is formed in the surface layer of the floating p-type well 7.

Meanwhile, in the area R2 of the field effect transistor for light signal detection, a floating p-type well 9 is formed on the n-type well 5 so that the edge thereof overlaps with the floating p-type well 7 in the lateral direction. Note that the impurity concentration of the floating p-type well 7 in the overlapping area with the floating p-type well 9 can be, for example, about $1\times10^{16}$ cm⁻³.

Further, a p-type embedded layer 8 disposed under the floating p-type well 9 is formed on the p⁻-type epitaxial layer 4. Further, an n-type channel doped layer 10 is formed on the surface layer of the floating p-type well 9, and in the floating p-type well 9, there is formed p⁺-type carrier pocket 11 disposed under the n-type channel doped layer 10. The p⁺-type carrier pocket 11 can be disposed near an n⁺⁺-type source layer 13b so as to be localized in a part of the n⁺-type channel doped layer 10. For example, the p⁺-type carrier pocket 11 can be disposed so as to surround the n⁺⁺-type source layer 13b.

A circular gate electrode 15 is formed on the n⁺-type channel doped layer 10 via a gate insulating film 14. The circular gate electrode 15 can be disposed so as to cover the overlapping portion of the floating p-type well 7 with the floating p-type well 9.

Further, the circular gate electrode 15 is provided with an opening 15', and a sidewall spacer 16 is formed on the sidewall of the circular gate electrode 15. Further, the n⁺-type source layer 13b surrounded with an n⁻-type source layer 12c in the periphery thereof is disposed in the opening 15' of the circular gate electrode 15, and the n⁺-type source layer 13b is connected to the n-type channel doped layer 10 via the n⁻-type source layer 12c.

Further, an n⁺-type drain layer 12b is disposed around the outer periphery of the circular gate electrode 15, and the n⁺-type drain layer 12b is connected to the n⁺-type impurity layer 12a. An n⁺⁺-type drain layer 13a is disposed so as to surround the periphery of the n⁺-type drain layer 12b and the n⁺-type impurity layer 12a.

The impurity concentration of the n⁺-type impurity layer 12a can be almost the same as the impurity concentration of the n⁺-type drain layer 12b, and the impurity concentrations of the n⁺-type impurity layer 12a and the n⁺-type drain layer 12b can be lower than the impurity concentrations of the n⁺⁺-type drain layer 13a and the n⁺⁺-type source layer 13b.

Further, the inter-layer insulating film 17 is formed in the light-receiving diode area R1 and the area R2 for the field effect transistor for light signal detection, and a drain voltage supply line 18, a vertical scanning signal supply line 19 and a vertical output line 20 are embedded in the inter-layer insulating film 17. The drain voltage supply line 18 is connected to the n⁺⁺-type drain layer 13a via a drain contact C1, the vertical scanning signal supply line 19 is connected to the circular gate electrode 15 via a gate contact C2, and the vertical output line 20 is connected to the n⁺⁺-type source layer 13b via a source contact C3.

Further, a light blocking film 21 is formed on the inter-layer insulating film 17, and the light blocking film 21 is provided with an opening 21' disposed corresponding to a light-receiving section of the light-receiving diode area R1.

Figure 3:
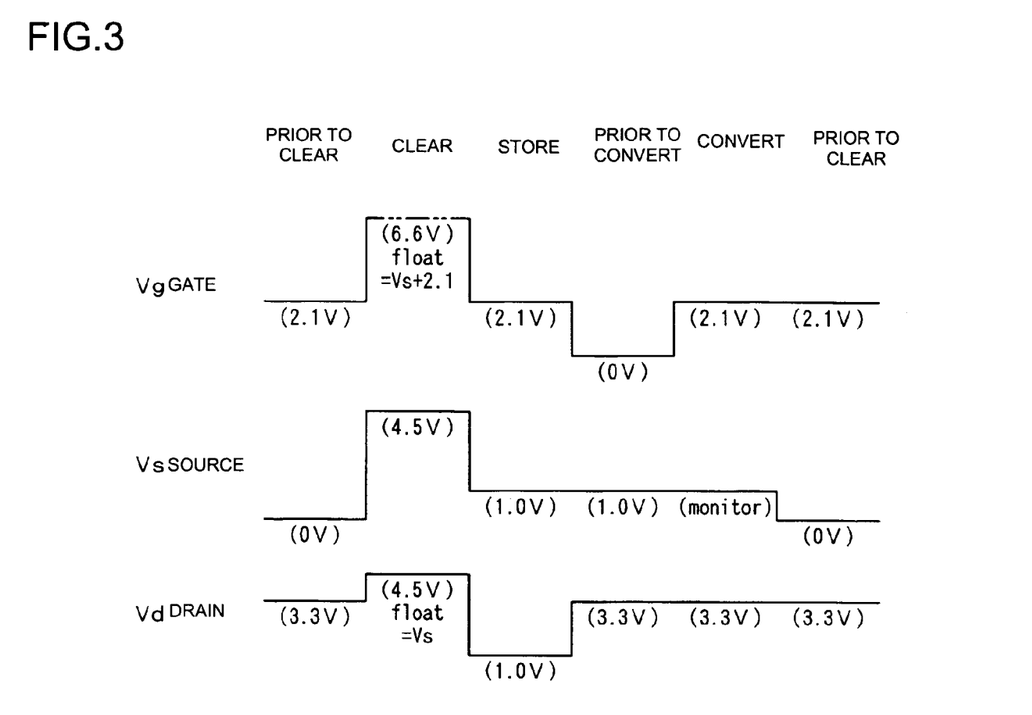
FIG. 3 is a timing chart showing an operation of the solid-state image sensing device shown in FIG. 1.

FIG. 3 is a timing chart showing the operation of the solid-state image sensing device according to FIG. 1.

In FIG. 3, prior to the clearing step, for example, a voltage of 2.1V is applied to the circular gate electrode 15 via the vertical scanning signal supply line 19, a voltage of 0V is applied to the n⁺⁺-type source layer 13b via the vertical output line 20, and a voltage of 3.3V is applied to the n⁺⁺-type drain layer 13a via the drain voltage supply line.

Then, in the clearing step, for example, a voltage of 6.6V is applied to the circular gate electrode 15 via the vertical scanning signal supply line 19, a voltage of 4.5V is applied to the n⁺⁺-type source layer 13b via the vertical output line 20, and a voltage of 4.5V is applied to the n⁺⁺-type drain layer 13a via the drain voltage supply line 18. Accordingly, the carriers stored in the p⁺-type carrier pocket 11 are swept out to the p-type semiconductor substrate 1 side by raising the potential of the surface side of the p-type semiconductor substrate 1. The carriers stored in the p⁺-type carrier pocket 11 can completely be removed by sweeping the carriers stored in the p⁺-type carrier pocket 11 out to the p-type semiconductor substrate 1 side. Therefore, thermal fluctuations in the amount of the carrier caused in the clearing step can be prevented, thus improving picture quality by removing generation of the kTC noise.

Further, by providing the p-type embedded layer 8 under the floating p-type well 9, the depletion layer can be prevented from extending to the n-type well 5, thereby efficiently applying to the depletion layer of the floating p-well 9 with an electric field applied via the circular gate electrode 15. Thus, the potential gradient in the depth direction of the floating p-type well 9 in the clearing step can be increased to enable the clearing operation of the carriers stored in the p⁺-type carrier pocket 11 to be efficiently executed.

Further, by disposing the overlapping section of floating p-type well 7 with the floating p-type well 9 under the circular gate electrode 15, the potential gradient in the depth direction of the overlapping section in the clearing step can be increased. Thus, if the potential in the overlapping section becomes deep by overlapping the floating p-type well 7 with the floating p-type well 9, it becomes possible to completely sweep out the carriers stored in the overlapping section in the direction of the p-type semiconductor substrate 1 to reduce the residual carrier in the clearing step, thus enabling reduction of the residual image level.

Figure 4:
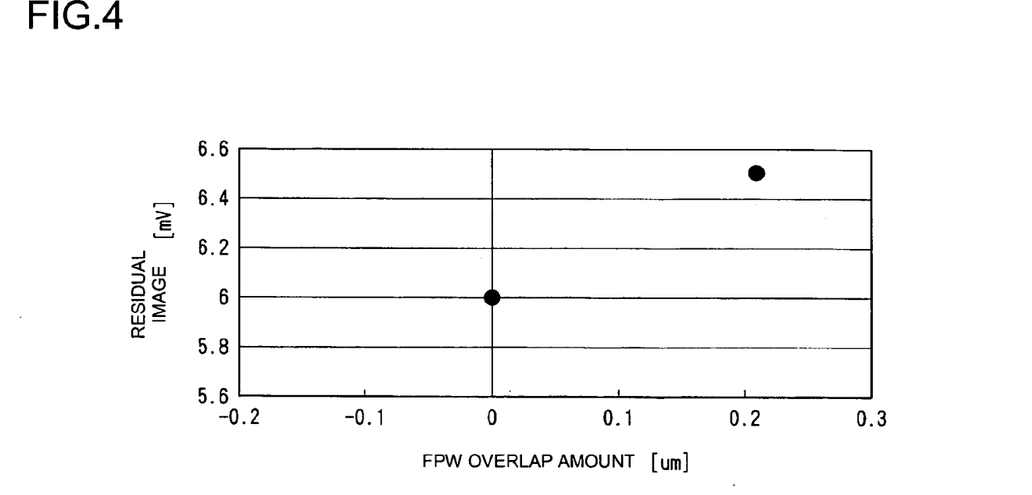
FIG. 4 is a view showing a relationship between the overlapping amount and the residual image level in the solid-state image sensing device shown in FIG. 1.

FIG. 4 is a view showing a relationship between the overlapping amount RV of the floating p-well 7 with the floating p-well 9 under the circular gate electrode 15 and the residual image level.

In FIG. 4, if the overlapping amount RV of the floating p-well 7 with the floating p-well 9 under the circular gate electrode 15 is 0 μm, the residual image level is 6 mV, and if the overlapping amount RV of the floating p-well 7 with the floating p-well 9 under the circular gate electrode 15 is 0.2 μm, the residual image level is 6.5 mV. Thus, the residual image level can be lowered by disposing the overlapping section of the floating p-well 7 with the floating p-well 9 under the circular gate electrode 15.

Then, in the storing step, for example, a voltage of 2.1V is applied to the circular gate electrode 15 via the vertical scanning signal supply line 19, a voltage of 1.0V is applied to the $n^{++}$-type source layer 13b via the vertical output line 20, and a voltage of 1.0V is applied to the $n^{++}$-type drain layer 13a via the drain voltage supply line 18. Then, a potential difference is created between the $n^{++}$-type source layer 13b, and the $n^{++}$-type drain layer 13a and the circular gate electrode 15 to induce electrons in the $n^+$-type channel doped layer 10. Further, the floating p-type well 7, the n-type well 5, and the n-type embedded layer 6 are depleted while the floating p-type well 9 is depleted, and an electric field from $n^{++}$-type drain layer 13a towards the $n^{++}$-type source layer 13b is generated.

Then, when a light beam input to the light-receiving diode area R1 reaches the depletion layer extending through the floating p-type well 7, the n-type well 5, and the n-type embedded layer 6, carriers consisting of electrons and electron holes are generated. The electron holes generated here flow into the $p^+$-type carrier pocket 11 via the floating p-type well 9, and are stored in the $p^+$-type carrier pocket 11.

By connecting the $n^{++}$-type drain layer 13a to the $n^+$-type impurity layer 12a via the $n^+$-type drain layer 12b, the potential can be gradually increased in the depth direction from the floating p-type well 7 to the n-type well 5 and the n-type embedded layer 6, thus, the electron holes generated in the floating p-type well 7, the n-type well 5, and the n-type embedded layer 6 can be transferred to the $p^+$-type carrier pocket 11 via the floating p-type well 9 while being prevented from flowing out to the p-type semiconductor substrate 1 side.

Further, by making the floating p-type well 7 overlap the floating p-type well 9, the potential in the border between the floating p-type well 7 and the floating p-type well 9 can be lowered even if a position shift is generated between the floating p-type well 7 and the floating p-type well 9. Therefore, the carriers generated in the light-receiving area R1 can be prevented from remaining in the light-receiving diode area R1 without being sent to the $p^+$-type carrier pocket 11, thus lowering the residual image level.

Further, by connecting the $n^+$-type impurity layer 12a with the n-type channel doped layer 10 via the $n^+$-type drain layer 12a, and by inducing electrons in the $n^+$-type channel doped layer 10 in the carrier storing step, a high density electron layer can be formed in the interfacial surface with the gate insulating film 14 and/or on the surface of the light-receiving diode. Accordingly, it is possible to couple the electrons existing in the electron layer with electron holes generated from interfacial defects, thus preventing generation of the dark current to reduce fixed pattern noises.

Furthermore, by making the impurity concentration of the $n^+$-type impurity layer 12a lower than the impurity concentration of the $n^{++}$-type drain layer 13a or the $n^{++}$-type source layer 13b, the depletion layer can be extended to the vicinity of the surface of the light-receiving diode area R1. Accordingly, it becomes possible to efficiently perform the photoelectric transfer with respect to light beams, such as a blue colored light beam, which have short wavelengths and are easy to reduce in the vicinity of the surface thereof, thus improving the sensitivity and the color reproducibility.

Further, by providing the n-type embedded layer 6 under the floating p-type well 7, the depletion layer can be extended in the depth direction of the floating p-type well 7. Accordingly, the carriers generated by light beams, such as a red colored light beam, having long wavelengths capable of reaching deep positions thereof can be efficiently collected, thus improving the sensitivity and the color reproducibility.

Furthermore, by disposing the $n^{++}$-type drain layer 13a in the periphery of the light-receiving diode area R1 and the area R2 of the field effect transistor for light signal detection, and by disposing the $p^+$-type impurity area 3 connected to the p-type semiconductor substrate 1 in the periphery of the $n^{++}$-type drain layer 13a, potential barriers can be formed in the peripheries of the light-receiving diode area R1 and the area R2 of the field effect transistor for light signal detection.

Accordingly, in case there is a defect in the interfacial surface with the element separation insulating film 2, the carriers caused by the defect can be prevented from flowing into the $p^+$-type carrier pocket 11, thus reducing fixed pattern noises caused by the defect.

Prior to the modulating step, for example, a voltage of 0V is applied to the circular gate electrode 15 via the vertical scanning signal supply line 19, a voltage of 1.0V is applied to the $n^{++}$-type source layer 13b via the vertical output line 20, and a voltage of 3.3V is applied to the $n^{++}$-type drain layer 13a via the drain voltage supply line 18, thereby making the carriers existing around the $p^+$-type carrier pocket 11 flow into the $p^+$-type carrier pocket 11.

Then, in the modulating step, for example, a voltage of 2.1V is applied to the circular gate electrode 15 via the vertical scanning signal supply line 19, and a voltage of 3.3V is applied to the $n^{++}$-type drain layer 13a via the drain voltage supply line 18, to make the field effect transistor formed in the area R2 of the field effect transistor for light signal detection operate in the saturation region thereof. Then, the potential of the $n^{++}$-type source layer 13b is read by a source follower via the vertical output line 20. When the carriers are stored in the $p^+$-type carrier pocket 11, the potential of the floating p-type well 9 rises in accordance with the amount of the stored carriers, and the source potential can be raised corresponding to the rise of the potential of the floating p-type well 9.

Accordingly, it is possible to alter the threshold voltage of the field effect transistor in accordance with the carriers photo-electrically transferred in the light-receiving diode area R1, and the alteration of the threshold voltage can be detected as an alteration of the source potential, thus enabling the linearity of the photoelectric transfer to be improved.

Further, by disposing the $p^+$-type carrier pocket 11 near the $n^{++}$-type source layer 13b so as to be localized in a part of the $n^+$-type channel doped layer 10, it is possible to increase the distance between the $p^+$-type carrier pocket 11 and the $n^{++}$-type drain layer 13a. Accordingly, the coupling capacitance of the $p^+$-type carrier pocket 11 with the $n^{++}$-type drain layer 13a can be reduced, thus improving the linearity in converting the carriers stored in the $p^+$-type carrier pocket 11 into voltages by the source follower, and the parasitic capacitance of the $p^+$-type carrier pocket 11 can be reduced, thus enhancing conversion efficiency.

Further, by reading the potential of the $n^+$-type source layer 13b by the source follower, the signal of each unit cell U can be read using an X-Y addressing method as is the case with CMOS sensors. Therefore, it is not necessary to transfer the carriers stored in each of the unit cells U to the final stage amplifier (a floating diffusion amplifier) as required in the CCD sensors, thus reducing power consumption.

Figure 5A:
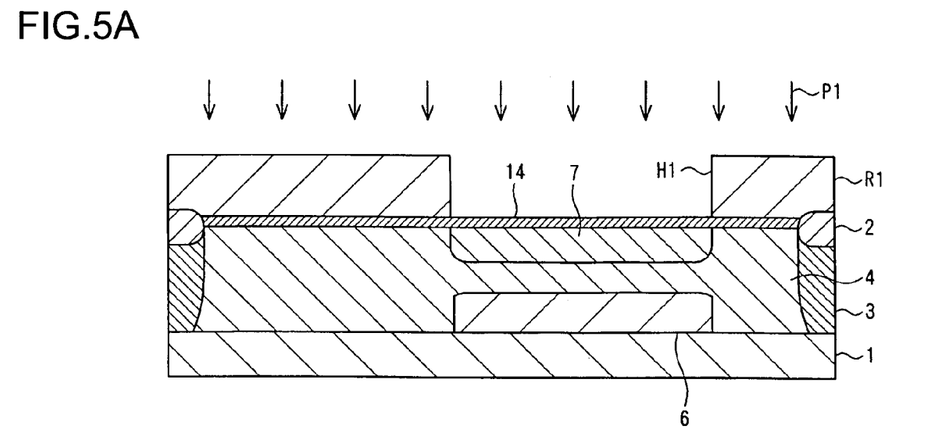
FIGS. 5A through 5C are cross-sectional views showing a method of fabricating the solid-state image sensing device according to a first embodiment of the present invention.
Figure 5B:
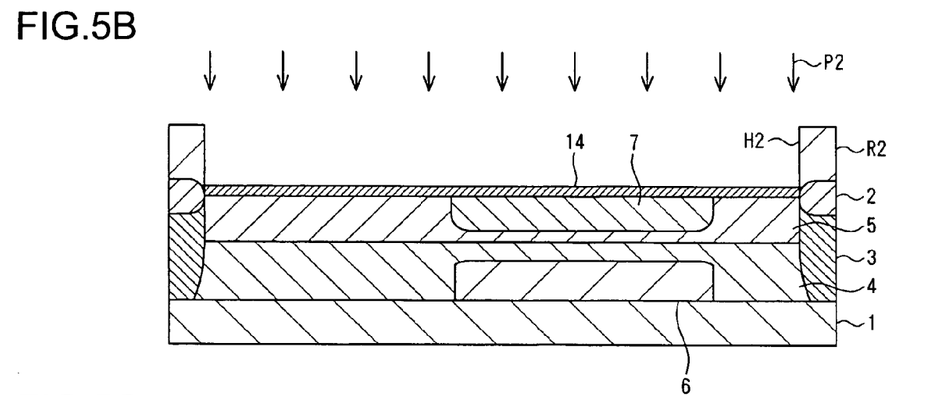
Figure 5C:
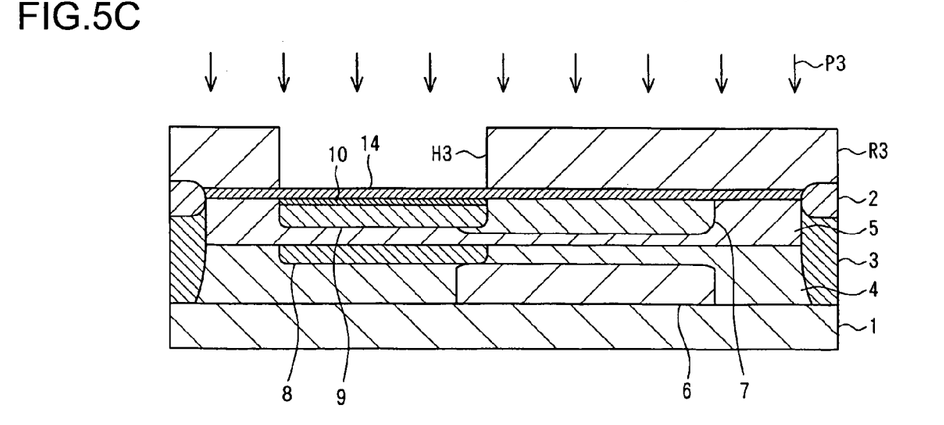
Figure 6A:
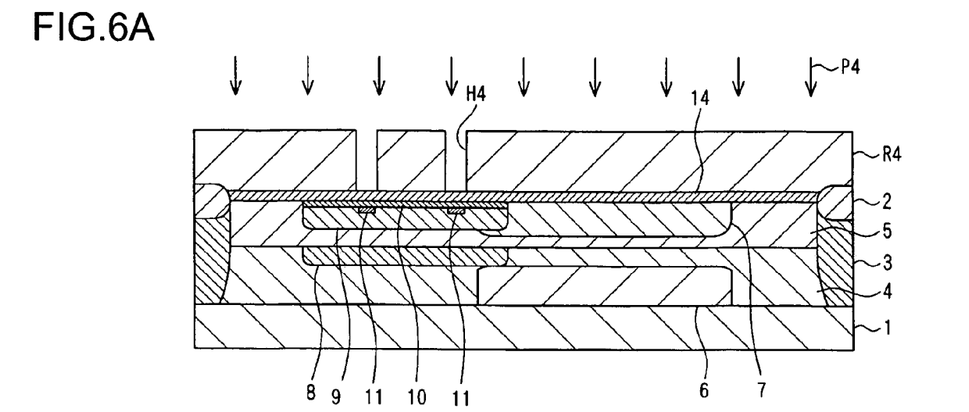
FIGS. 6A through 6C are cross-sectional views showing a method of fabricating the solid-state image sensing device according to a first embodiment of the present invention.
Figure 6B:
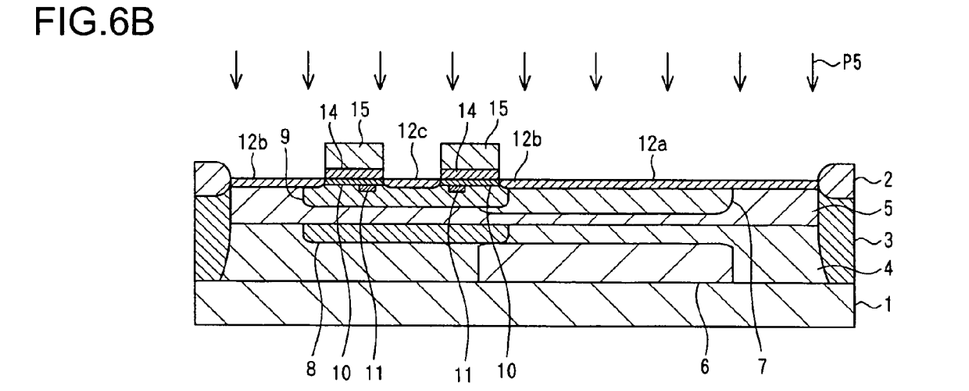
Figure 6C:
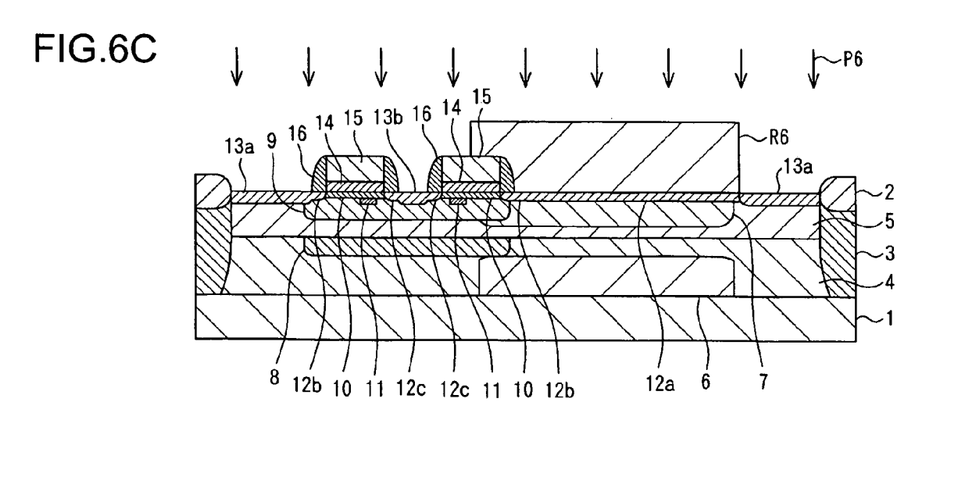

FIGS. 5 and 6 are cross-sectional views showing a method of fabricating the solid-state image sensing device according to the first embodiment of the present invention.

In FIG. 5A, the p-type epitaxial layer 4 is formed on the p⁻-type semiconductor substrate 1 by the epitaxial growth. Then, by selectively executing the ion implantation with an impurity ion such as boron (B) after forming the element separation insulating film 2 by a Local Oxidation of Silicon (LOCOS) method, the p⁺-type impurity area 3 embedded in the p⁻-type epitaxial layer 4 is formed under the element separation insulating film 2.

Then, after forming the gate insulating film 14 on the p⁻-type epitaxial layer 4 using a method such as thermal oxidation of the p⁻-type epitaxial layer 4 or the like, a resist pattern R1 provided with an opening H1 is formed using photolithography.

Then, the floating p-type well 7 is formed by executing ion implantation P1 with an impurity ion such as boron (B) in the p⁻-type epitaxial layer 4, using the resist pattern R1 as a mask. Further, the n-type embedded layer 6 disposed under the floating p-type well 7 is formed by executing the ion implantation P1 with an impurity ion such as P or As in the area deeper than the floating p-type well 7 using the resist pattern R1 as a mask.

Then, as shown in FIG. 5B, a resist pattern R2 provided with an opening H2 is formed using photolithography after removing the resist pattern R1. Then, the n-type well 5 is formed by executing ion implantation P2 with an impurity ion such as P or As in the p⁻-type epitaxial layer 4, using the resist pattern R2 as a mask.

Then, as shown in FIG. 5C, a resist pattern R3 provided with an opening H3 is formed using photolithography after removing the resist pattern R2. Then, the floating p-type well 9 is formed by executing ion implantation P3 with an impurity ion such as B in the p⁻-type epitaxial layer 4, using the resist pattern R3 as a mask.

Further, the p-type embedded layer 8 disposed under the floating p-type well 9 is formed by executing the ion implantation P3 with the impurity ion such as B in the area deeper than the floating p-type well 9 using the resist pattern R3 as a mask. Further, the n-type channel doped layer 10 disposed in the surface layer of the floating p-type well 9 is formed by executing the ion implantation P3 with the impurity ion such as P or As in the surface of the floating p-type well 9 using the resist pattern R3 as a mask.

Then, as shown in FIG. 6A, a resist pattern R4 provided with an opening H4 is formed using photolithography after removing the resist pattern R3. Then, the p⁺-type carrier pocket 11 disposed under the n-type channel doped layer 10 is formed in the floating p-type well 9 by executing ion implantation P4 with an impurity ion such as B in the floating p-type well 9 using the resist pattern R4 as a mask.

Then, as shown in FIG. 6B, after removing the resist pattern R4, by depositing a polycrystal semiconductor film using CVD or the like and then patterning the polycrystal semiconductor film using photolithography and etching, the circular gate electrode 15 disposed on the n-type channel doped layer 10 is formed so as to cover the overlapping section of the floating p-type well 7 with the floating p-type well 9.

Thus, the overlapping portion of the floating p-type well 7 with the floating p-type well 9 can be disposed under the circular gate electrode 15 by modifying the mask pattern. Therefore, without any additional fabrication step, the residual carrier in the clearing step can be reduced, thus reducing the residual image level.

Further, by executing ion implantation P5 with an impurity ion such as P or As using the circular gate electrode 15 as a mask, the n⁺-type drain layer 12b and the n⁺-type source layer 12c respectively disposed inside and outside of the circular gate electrode 15 are formed, and also, the n⁺-type impurity layer 12a is formed in the surface layer of the floating p-type well 7.

Then, as shown in FIG. 6C, the insulating film is formed using CVD or the like, and then the insulating film is etched back using anisotropic etching such as RIE to form the sidewall spacers 16 on the side surfaces of the circular gate electrode 15.

Further, the resist pattern R6 disposed on the floating p-type well 7 is then formed using photolithography. By executing ion implantation P6 with an impurity ion such as P or As using the circular gate electrode 15, the sidewall spacer 16, and the resist pattern R6 as masks, the n⁺⁺-type source layer 13b is formed inside the n⁺-type source layer 12c, and also the n⁺⁺-type drain layer 13a is formed so as to surround the periphery of the n⁺-type source layer 12c and the n⁺-type impurity layer 12a.

Then, as shown in FIG. 2, after removing the resist pattern R6, the interlayer insulating film 17 is formed using CVD or the like. Thereafter, by patterning the interlayer insulating film 17 using photolithography and etching, an opening for exposing the surfaces of the n⁺⁺-type drain layer 13a, the n⁺⁺-type source layer 13b, and the circular gate electrode 15 is provided in the interlayer insulating film 17.

Further, by depositing tungsten on the interlayer insulating film 17 provided with the opening, using, for example, sputtering or the like, and then etching back the tungsten, plugs respectively connected to the n⁺⁺-type drain layer 13a, n⁺⁺-type source layer 13b, and the circular gate electrode 15 are embedded in the interlayer insulating film 17.

Then, by depositing Al on the interlayer insulating film 17 having the plugs embedded therein using, for example, sputtering or the similar methods, and then patterning the Al using photolithography and etching, the drain voltage supply line 18, the vertical output line 20, and the vertical scanning signal supply line 19 respectively connected to the n⁺⁺-type drain layer 13a, n⁺⁺-type source layer 13b, and the circular gate electrode 15 are formed in the interlayer insulation film 17.

By depositing Al on the interlayer insulating film 17 having the drain voltage supply line 18, the vertical output line 20, and the vertical scanning signal supply line 19 formed thereon using, for example, sputtering or the similar methods, and then patterning the Al using photolithography and etching, the light blocking film 21 provided with the opening section 21' is formed on the interlayer insulating film 17.

Accordingly, the VMIS sensor can be formed by applying a CMOS process, and substantially the same image quality as CCD sensors can be realized, and also the peripheral circuit can easily be integrated, and further, a small-sized and low-priced solid-state image sensing device can be realized.

Figure 7:
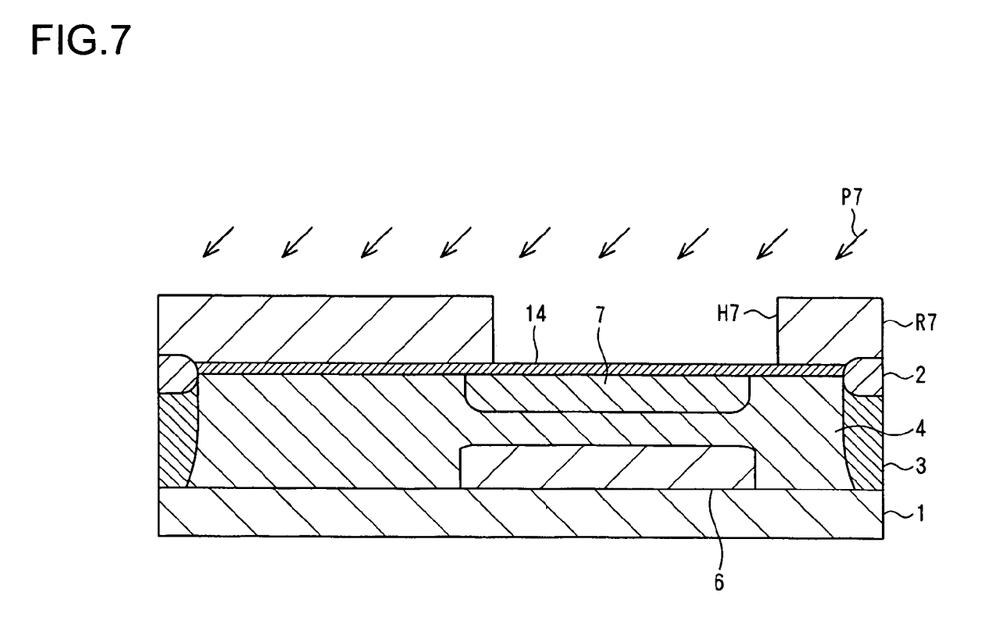
FIG. 7 is a cross-sectional view showing a method of fabricating a solid-state image sensing device according to a second embodiment of the present invention.

FIG. 7 is a cross-sectional view showing a method of fabricating the solid-state image sensing device according to the second embodiment of the present invention.

In FIG. 7, the p⁻-type epitaxial layer 4 is formed on the p-type semiconductor substrate 1. Then, the resist pattern R7 provided with an opening H7 is formed using photolithography. Then, the floating p-type well 7 is formed by executing ion implantation P7 with an impurity ion such as B towards the area R2 of the field effect transistor for light signal detection in a slanted direction, using the resist pattern R7 as a mask. Thereafter, the same steps as described above with reference to FIGS. 5 and 6 are executed.

Thus, the overlapping portion of the floating p-type well 7 with the floating p-type well 9 can be disposed under the circular gate electrode 15 without modifying the mask pattern. Therefore, without any additional fabrication step, the residual carrier in the clearing step can be reduced, thus reducing the residual image level.

Although in the embodiments described above, the method is explained in which the floating p-type wells 7 and 9 are formed on the p-type semiconductor substrate 1, the n-channel field effect transistor is formed in the area R2 of the field effect transistor for light signal detection, and the electron holes are stored in the carrier pocket, it is also possible that a floating n-type well is formed on an n-type semiconductor substrate 1, and a p-channel field effect transistor is formed in the area R2 of the field effect transistor for light signal detection, and also electrons are stored in the carrier pocket.

What is claimed is:

1. A solid-state image sensing device comprising:
   a semiconductor area of a first conductivity type having a first well of a second conductivity type formed therein;
   a second well of the second conductivity type formed in the semiconductor area, the second well overlapping the first well in a lateral direction thereof at an end portion of the second well;
   a gate electrode disposed on the second well so as to cover the overlapping portion;
   a drain layer of the first conductivity type disposed on one side of the gate electrode;
   a source layer of the first conductivity type disposed on the other side of the gate electrode;
   a channel area disposed under the gate electrode, the channel area being located between the drain layer and the source layer;
   a carrier pocket of the second conductivity type disposed under the channel area, and in the second well of the second conductivity type;
   a semiconductor substrate of the second conductivity type on which the semiconductor area of the first conductivity type is located;
   an embedded layer of the first conductivity type disposed under the semiconductor area of the first conductivity type corresponding to a position of the first well; and
   an embedded layer of the second conductivity type disposed under the semiconductor area of the first conductivity type corresponding to a position of the second well and a region where the second well overlaps the first well.

2. The solid-state image sensing device according to claim 1, further comprising:
   an impurity layer of the first conductivity type in a surface layer of the first well; and
   a channel doped layer of the first conductivity type formed in a surface layer of the channel area.

3. The solid-state image sensing device according to claim 1, wherein the carrier pocket is disposed near the source layer so as to be localized in a part of the channel area.

4. The solid-state image sensing device according to claim 2, wherein:
   the gate electrode has a circular shape;
   the source layer is formed in a surface layer of the second well so as to be disposed inside the circular gate electrode; and
   the drain layer extends to the impurity layer of the first conductivity type so as to be disposed outside the circular gate electrode.

5. A method of fabricating a solid-state image sensing device, comprising:
   forming a first well of a second conductivity type in a semiconductor area of the second conductivity type by ion implanting an impurity using a first resist pattern as a mask;
   forming an embedded layer of a first conductivity type under the first well by ion implanting an impurity using the first resist pattern as a mask;
   forming a second well of the second conductivity type so as to overlap with the first well in a lateral direction thereof at an edge portion of the second well in the semiconductor area by ion implanting an impurity using a second resist pattern as a mask;
   forming an embedded layer of the second conductivity type under the second well and a region where the second well overlaps the first well by ion implanting an impurity using the second resist pattern as a mask;
   forming a channel doped layer of the first conductivity type in a surface layer of the second well by ion implanting an impurity using the second resist pattern as a mask;
   forming a carrier pocket of the second conductivity type under the channel doped layer by ion implanting an impurity using a third resist pattern as a mask;
   forming a gate electrode on the channel doped layer so as to cover the overlapping section; and
   ion implanting an impurity using the gate electrode as a mask to form a drain layer of the first conductivity type and a source layer of the first conductivity type respectively on both sides of the gate electrode, and to form an impurity layer of the first conductivity type in a surface layer of the first well.

6. The method of fabricating a solid-state image sensing device according to claim 5, wherein the ion implanting for forming the first well is executed in a slanted direction towards the second well.

* * * * *